(12) United States Patent
Yamaguchi

(10) Patent No.: US 12,166,123 B2
(45) Date of Patent: Dec. 10, 2024

(54) SEMICONDUCTOR DEVICE

(71) Applicant: RENESAS ELECTRONICS CORPORATION, Tokyo (JP)

(72) Inventor: Tadashi Yamaguchi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 18/163,046

(22) Filed: Feb. 1, 2023

(65) Prior Publication Data

US 2023/0187550 A1    Jun. 15, 2023

Related U.S. Application Data

(63) Continuation of application No. 17/038,784, filed on Sep. 30, 2020.

(51) Int. Cl.
*H01L 21/28* (2006.01)
*G11C 11/22* (2006.01)
(Continued)

(52) U.S. Cl.
CPC ...... *H01L 29/78391* (2014.09); *G11C 11/221* (2013.01); *G11C 11/223* (2013.01);
(Continued)

(58) Field of Classification Search
None
See application file for complete search history.

(56) References Cited

U.S. PATENT DOCUMENTS 6,750,501 B2    6/2004  Tarui et al.
2002/0024073 A1  2/2002  Shimada et al.
(Continued)

FOREIGN PATENT DOCUMENTS

EP    1 143 525 A2    10/2001
JP    H05-090607 A     4/1993
(Continued)

OTHER PUBLICATIONS

Schroeder Uwe et al., "Lanthanum-Doped Hafnium Oxide: A Robust Ferroelectric Material", Inorganic Chemistry, vol. 57, No. 5, Mar. 5, 2018 (Mar. 5, 2018), pp. 2752-2765.
(Continued)

*Primary Examiner* — Xiaoming Liu
(74) *Attorney, Agent, or Firm* — Rimon P.C.

(57) ABSTRACT

A Semiconductor device includes a semiconductor substrate, an insulating film, a first conductive film, a ferroelectric film, an insulating layer, a first plug and a second plug. The semiconductor substrate includes a source region and a drain region which are formed on a main surface thereof. The insulating film is formed on the semiconductor substrate such that the insulating film is located between the source region and the drain region in a plan view. The first conductive film is formed on the insulating film. The ferroelectric film is formed on the first conductive film. The insulating layer covers the first conductive film and the ferroelectric film. The first plug reaches the first conductive film. The second plug reaches the ferroelectric film. A material of the ferroelectric film includes hafnium and oxygen. In plan view, a size of the ferroelectric film is smaller than a size of the insulating film.

14 Claims, 29 Drawing Sheets

(51) Int. Cl.
*H01L 23/522* (2006.01)
*H01L 29/423* (2006.01)
*H01L 29/66* (2006.01)
*H01L 29/78* (2006.01)

(52) U.S. Cl.
CPC .... *H01L 23/5226* (2013.01); *H01L 29/40111* (2019.08); *H01L 29/42364* (2013.01); *H01L 29/6684* (2013.01); *G11C 11/2273* (2013.01); *G11C 11/2275* (2013.01)

(56) References Cited

U.S. PATENT DOCUMENTS

| | | | | |
|---|---|---|---|---|
| 2002/0043676 | A1* | 4/2002 | Ohtsuka | H10B 53/30 |
| | | | | 257/295 |
| 2018/0166582 | A1* | 6/2018 | Liao | H10B 51/30 |
| 2019/0097060 | A1* | 3/2019 | Leobandung | H01L 29/7885 |
| 2019/0355584 | A1 | 11/2019 | Yamaguchi | |
| 2020/0091276 | A1* | 3/2020 | Cheng | H01L 29/66545 |

FOREIGN PATENT DOCUMENTS

| | | |
|---|---|---|
| JP | H08-511895 A | 12/1996 |
| JP | 2001-118941 A | 4/2001 |
| JP | 2001-332705 A | 11/2001 |
| JP | 2019-201172 A | 11/2019 |
| WO | 1995027982 A1 | 10/1995 |

OTHER PUBLICATIONS

Kim Si Joon et al., "Ferroelectric Hf0.5Zr0.5O2 Thin Films: A Review of Recent Advances", JOM: Journal of Metals, Springer New York LLC, United States, vol. 71, No. 1, Sep. 28, 2018 (Sep. 28, 2018), pp. 246-255.

Extended European Search Report issued in corresponding European Patent Application No. 21197279.9-1212, dated Feb. 10, 2022.

U.S. PTO Non-Final Office Action issued in related parent U.S. Appl. No. 17/038,784, dated Mar. 17, 2022.

U.S. PTO Final Office Action issued in related parent U.S. Appl. No. 17/038,784, dated Sep. 22, 2022.

U.S. Appl. No. 17/038,784, filed Sep. 30, 2020.

Office Action dated Jul. 23, 2024, from corresponding Japan Patent Application No. 2021-156924, 8 pages.

* cited by examiner

FIG. 5

| VOLTAGE [V] \ OPERATION | $V_s$ | $V_d$ | $V_w$ | $V_1$ | $V_2$ |
|---|---|---|---|---|---|
| WRITE | 0 | 0 | $V_{EC}$ | $-V_{EC}$ | $V_{EC}$ |
| ERASE | 0 | 0 | $-V_{EC}$ | $V_{EC}$ | $-V_{EC}$ |
| READ | $V_{dd}$ | 0 | 0 | $V_R$ | $V_R$ |

SEMICONDUCTOR DEVICE

CROSS-REFERENCE TO RELATED APPLICATIONS

This is a Continuation of U.S. patent application Ser. No. 17/038,784 filed on Sep. 30, 2020, the entire contents are incorporated in its entirety.

BACKGROUND

The present disclosure relates to a semiconductor device, for example, a semiconductor device having a ferroelectric film.

There is a disclosed technique listed below.
[Patent Document 1] Japanese Unexamined Patent Application Publication No. 2019-201172

A ferroelectric memory including a ferroelectric film are known as a storage element operating at low voltages. In the ferroelectric memory, a write state and an erase state are determined in accordance with a polarization direction of the ferroelectric film.

A semiconductor device described in Patent Document 1 includes a semiconductor substrate, an insulating film formed on the semiconductor substrate, a ferroelectric film formed on the insulating film, a metal film formed on the ferroelectric film, and a gate electrode formed on the metal film. The ferroelectric film described in Patent Document 1 is formed by performing heat treatment to a laminated film including a first amorphous film, a plurality of particles formed on the first amorphous film, and a second amorphous film formed on the first amorphous film so as to cover the plurality of particles. Thus, the plurality of particles functions as nuclei, a crystal grain size in the ferroelectric film becomes uniform. As a result, a variation of a threshold voltage of the semiconductor device can be reduced.

SUMMARY

In the above semiconductor device, the ferroelectric film and the insulating film is two capacitive components coupled in series with each other. Therefore, a rewrite voltage applied to the gate electrode is distributed respectively to the ferroelectric film and the insulating film. From the viewpoint of increasing the partial voltage of the ferroelectric film, it is preferable to increase a thickness of the ferroelectric film, or to reduce a thickness of the insulating film. However, if the thickness of the insulating film is too small, a reliability of the semiconductor device deteriorates. Thus, the conventional semiconductor device has room to be improved from the viewpoint of enhancing reliability.

It is an object of the embodiment to enhancing the reliability of the semiconductor device. Other objects and novel features will become apparent from the description of the specification and drawings.

A semiconductor device according to embodiments includes an semiconductor substrate including a source region and a drain region formed on a main surface of the semiconductor substrate; an insulating film formed on the main surface of the semiconductor substrate such that the insulating film is located between the source region and the drain region in a plan view; a first conductive film formed on the insulating film; a ferroelectric film formed on the first conductive film; an insulating layer formed on the semiconductor substrate such that the insulating layer covers the first conductive film and the ferroelectric film; a first plug formed in the insulating layer such that the first plug reaches the first conductive film; and a second plug formed in the insulating layer such that the second plug reaches the ferroelectric film. A material of the ferroelectric film contains hafnium and oxygen. In plan view, a size of the ferroelectric film is smaller than a size of the insulating film.

In the semiconductor device according to the embodiments, the reliability of the semiconductor device is enhanced.

BRIEF DESCRIPTION OF THE DRAWINGS

FIG. 5 is a table showing an exemplary voltage applied to respective portions of the semiconductor device according to the embodiment in each of a write operation, a erase operation, and a read operation.

DETAILED DESCRIPTION

Figure 1:
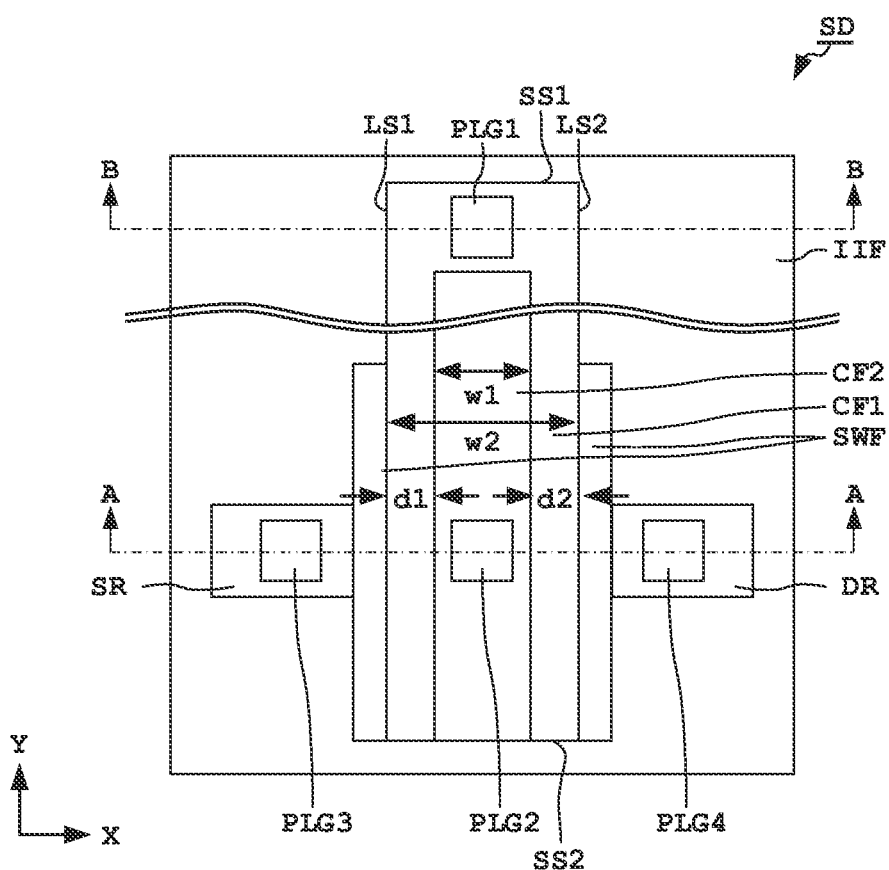
FIG. 1 is a plan view illustrating an exemplary configuration of a main portion of a semiconductor device according to an embodiment.

Hereinafter, a semiconductor device according to an embodiment will be described in detail by referring to the drawings. In the specification and drawings, the same or corresponding elements are denoted by the same reference numerals and/or hatching, and a repetitive description thereof is omitted. In the drawings, for convenience of description, the configuration may be omitted or simplified. In addition, a cross-sectional view may be shown as an end view from the viewpoint of visibility. A plan view may also be hatched.

Configuration of Semiconductor Device

Figure 2:
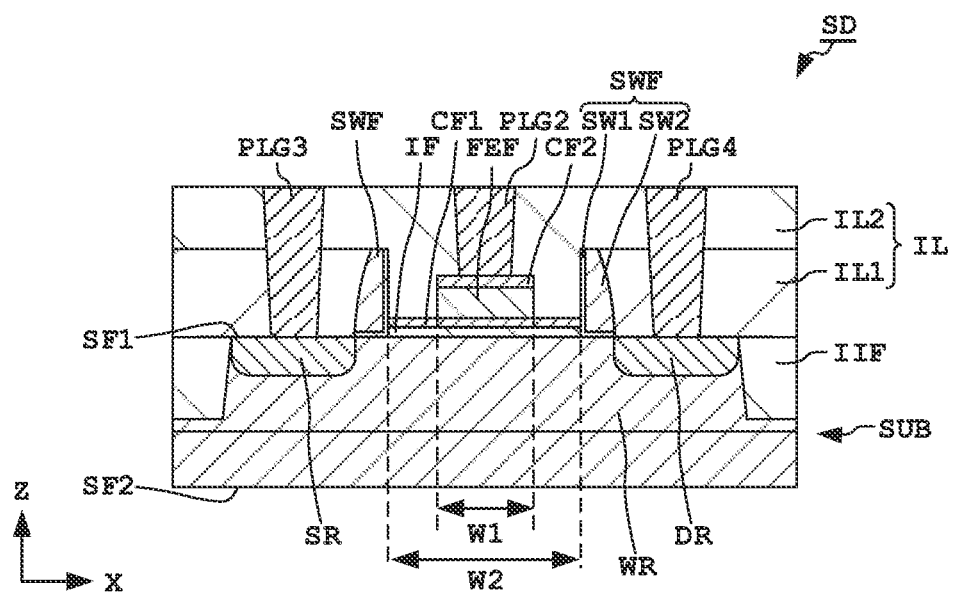
FIG. 2 is a cross-sectional view illustrating an exemplary configuration of the main portion of the semiconductor device according to the embodiment.
Figure 3:
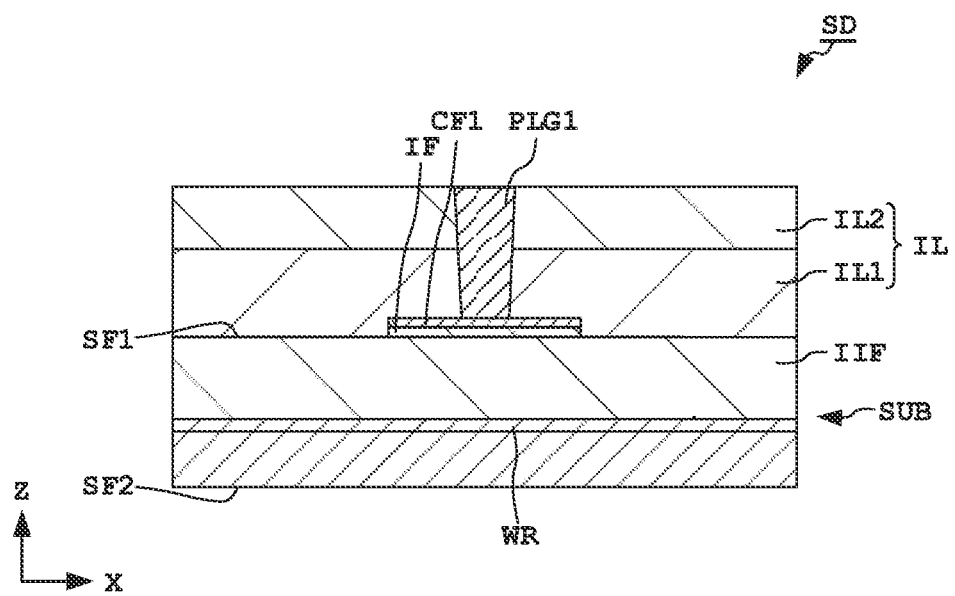
FIG. 3 is a cross-sectional view illustrating an exemplary configuration of the main portion of the semiconductor device according to the embodiment.

FIG. 1 is a plan view illustrating an exemplary configuration of a main portion of a semiconductor device SD according to present embodiment. FIG. 2 is a cross-sectional view illustrating an exemplary configuration of the main portion of the semiconductor device SD according to the present embodiment. FIG. 2 is the cross-sectional view taken along line A-A of FIG. 1. FIG. 3 is a cross-sectional view illustrating an exemplary configuration of the main portion of the semiconductor device SD according to the present embodiment. FIG. 3 is the cross-sectional view taken along line B-B of FIG. 1.

The semiconductor device SD includes a semiconductor substrate SUB, an isolation insulating film IIF, an insulating film IF, a first conductive film CF1, a ferroelectric film FEF, a second conductive film CF2, a pair of sidewall insulating films SWF, an insulating layer IL, a first plug PLG1, a second plug PLG2, a third plug PLG3 and a fourth plug PLG4. In FIG. 1, the insulating layer IL is omitted from the viewpoint of visibility.

As shown in FIGS. 1-3, X, Y and X directions are as follows: The X-direction is an opposing direction in which a source region SR and a drain region DR are opposite to each other. The X-direction is along a main surface of the semiconductor substrate SUB (a first surface SF1). Y-direction, in plan view, is a direction along a long side of the ferroelectric film FEF. The Y-direction, in plan view, is a direction perpendicular to the X direction. Z-direction is a thickness direction of the ferroelectric film FEF. X-direction, Y-direction and Z-direction are perpendicular to each other.

The semiconductor substrate SUB has a first surface (main surface) SF1, and a second surface SF2 opposite to the first surface SF1. The first surface SF1 of the semiconductor substrate SUB, a semiconductor element such as a transistor, a resistor and a capacitor may be formed. In the present embodiment, a ferroelectric memory cell is formed on the first surface SF1 of the semiconductor substrate SUB. A Type of the semiconductor substrate SUB is, for example, a silicon-single-crystal substrate. Resistivity of the semiconductor substrate SUB, for example, 1 Ω·cm or more and 10 Ω·cm or less.

The first surface SF1 of the semiconductor substrate SUB, a well region WR, the source region SR, the drain region DR and the isolation insulating film IIF are formed. The well region WR, the source region SR and the drain region DR constitute a portion of the ferroelectric memory cell.

The well region WR directly contacts with the source region SR and the drain region DR. In the first surface SF1, the well region WR is formed between the source region SR and the drain region DR. A part of the well region WR, in plan view, overlaps with the source region SR and the drain region DR. The well region WR contains an impurity of a predetermined concentration.

The source region SR and the drain region DR are spaced apart from each other. Each of the source region SR and the drain region DR contains an impurity of a predetermined concentration. From the viewpoint of reducing a contact resistance with the plug, a silicide layer may be formed on an upper surface of each of the source region SR and the drain region DR. A material of the silicide layer is, for example, cobalt silicide, nickel silicide, platinum silicide, or nickel platinum silicide.

The isolation insulating film IIF, in plan view, surrounds a region which functions as the ferroelectric memory cell. The isolation insulating film IIF, in plan view, is formed such that isolation insulating film IIF surrounds a region sandwiched between the source region SR and the drain region DR (a part of the well region WR), the source region SR, and the drain region SR. The isolated insulating film IIF is formed on the first surface SF1 of the semiconductor substrate SUB. A material of the isolation insulating film IIF is, for example, silicon oxide.

The insulating film IF suppresses from introducing unintentional electrons into the ferroelectric film FEF from the semiconductor substrate SUB during operation of the semiconductor device SD. The insulating film IF is formed on the first surface SF1 of the semiconductor substrate SUB. The insulating film IF is formed such that the insulating film IF is located between the source region SR and the drain region DR. A part of the insulating film IF is formed on the well region WR. Another part of the insulating film IF is formed on the isolation insulating film IIF.

The insulating film IF may be a single-layer film or a multi-layer film. In the present embodiment, the insulating film IF is a multi-layer film including a silicon oxide film and a hafnium oxide film. The hafnium oxide film is formed on the silicon oxide film. A thickness of the insulating film IF is, for example, 1 nm or more and 3 nm or less.

The first conductive film CF1 is formed on the insulating film IF. From the viewpoint of suppressing the first plug PLG1 penetrates the first conductive film CF1, it is preferable that a thickness of the first conductive film CF1 is large. Further, when the first conductive film CF1 is formed integrally in the plurality of the ferroelectric memory cells (not shown), it is preferable that the resistance value of the first conductive film CF1 is large from the viewpoint of suppressing the voltage from being applied to another ferroelectric memory cell. In this instance, the thickness of the first conductive film CF1 is preferably small. For example, the thickness of the first conductive film CF1 is preferably smaller than a thickness of the second conductive film CF2. In view of the above, the thickness of the first conductive film CF1 is preferably 1 nm or more and 5 nm or less. A material of the first conductive film CF1 is, for example, titanium nitride, tantalum nitride or tungsten.

A part of the first conductive film CF1 is exposed from the ferroelectric film FEF. Thus, it is possible to secure a region for the first plug PLG1 reaching the first conductive film CF1. The first plug PLG1 is formed on the part of the first conductive film CF1.

A shape of the first conductive film CF1 is not particularly limited. In present embodiment, the shape of the first conductive film CF1, in a plan view, is substantially rectangular. The first conductive film CF1 has a first long side LS1, a second long side LS2, a first short side SS1 and a second short side SS2. The first long side LS1 and the second long side LS2, in the first conductive film CF1, are located on opposite sides to each other. The first short side SS1 and the second short side SS2, in the first conductive film CF1, are located on opposite sides to each other.

The ferroelectric film FEF is formed on a part of the first conductive film CF1. In plan view, a size of the ferroelectric film FEF is smaller than a size of the insulating film IF and the first conductive film CF1. Thus, it is possible to secure a region for the first plug PLG1 reaching the first conductive film CF1.

The ferroelectric film FEF may directly contact with the sidewall insulating film SWF, or may be spaced apart from the sidewall insulating film SWF. In the present embodiment, the ferroelectric film FEF is spaced apart from the sidewall insulating film SWF and indirectly contacts with the sidewall insulating film SWF through a part of the insulating layer IL. For example, when the insulating layer IL (an insulating layer IL2) is an insulating film having a low dielectric constant, the ferroelectric film FEF is preferably spaced apart from the sidewall insulating film SWF from the viewpoint of reducing a size of the capacitance components formed by the first plug PLG1, third plug PLG3, the fourth plug PLG4, and the first conductive film CF1.

The size and position of the ferroelectric film FEF are not particularly limited as long as a region for forming the first plugs PLG1 can be secured. In the X-direction, a length (width) w1 of the ferroelectric film FEF may be the same as a length (width) w2 of the first conductive film CF1, or may be smaller than the w2. From the viewpoint of manufacturing cost, it is preferable that the w1 is the same as the w2. If the w1 is the same as the w2, it is possible to reduce the number of masks used in the photolithography process. From the viewpoint of low power consumption, it is preferable that the w1 is smaller than the w2. In the present embodiment, the w1 is smaller than the w2.

Further, in the X-direction, a distance d1 between the first long side LS1 and the ferroelectric film FEF may be substantially the same as a distance d2 between the second long side LS2 and the ferroelectric film FEF, or may be different from the d2. In plan view, when the first plug PLG1 is formed between the two sidewall insulating films SWF, it is preferable that the d1 is different from the d2 from the viewpoint of ensuring a space in which the first plug PLG1 is formed (first modification to be described later, see FIG. 25). In the present embodiment, the d1 is substantially the same as the d2.

A thickness of the ferroelectric film FEF is, for example, 10 nm or more and 20 nm or less. The ferroelectric film FEF may be a single-layer film or a multi-layer film. In the present embodiment, the ferroelectric film FEF is a single layer film.

A material of the ferroelectric film FEF is ferroelectric. The ferroelectric has a characteristic that when an electric field is applied, dielectric polarization occurs, and thereafter, even if the application of an electric field is stopped, the polarization state is maintained. A crystal structure of the ferroelectric film FEF is mainly rectangular. Thus, the characteristics of the ferroelectric is obtained. The crystal structure of the ferroelectric film FEF, when not rectangular, the characteristics of the paramagnetic is expressed, it is impossible to obtain the desired characteristics as a ferroelectric memory. The material of the ferroelectric film FEF has a higher dielectric constant than, for example, silicon nitride. For example, the material of the ferroelectric film FEF contains hafnium (Hf) and oxygen (O). That is, the ferroelectric film FEF is a hafnium oxide film. The ferroelectric film FEF may further include zirconium (Zr), silicon (Si), germanium (Ge), yttrium (Y), lanthanum (La), or ytterbium (Yb).

The ferroelectric film FEF preferably further contains a crystallization promotion material. The crystallization promotion material, in crystallization step (forming step of the ferroelectric film FEF), functions as a nucleus, to promote the crystallization of the ferroelectric film FEF. The crystallize promotion material is, for example, aluminum (Al), carbon (C) or fluorine (F) The crystallization promotion material may be uniformly contained or partially contained in the ferroelectric film FEF as a whole. When the crystallization promotion material is partially contained in the ferroelectric film FEF, the crystallization promotion material, in the thickness direction of the ferroelectric film FEF, preferably dispersed in a vicinity of the center of the ferroelectric film FEF. As a result, crystallization is promoted uniformly in the ferroelectric film FEF as a whole.

The second conductive film CF2 is formed on the ferroelectric film FEF. The second conductive film CF2 is formed between the ferroelectric film FEF and the second plug PLG2. The second conductive film CF2 stresses the ferroelectric film FEF in a manufacturing process of the semiconductor device SD, and controls an orientation of a crystal of the ferroelectric film FEF. From the viewpoint of uniformly controlling the orientation of the crystal of the ferroelectric film FEF, the second conductive film CF2 is preferably formed on an entire of an upper surface of the ferroelectric film FEF. In plan view, a size of the second conductive film CF2 may be greater or smaller than a size of the second plug PLG2.

Incidentally, even if the second conductive film CF2 is removed, when the orientation of the crystal is strongly controlled to the extent that the orientation of the crystal of the ferroelectric film FEF remains, the semiconductor device SD may not include the second conductive film CF2. From the viewpoint of reducing variations in the orientation in the ferroelectric film FEF, it is preferable that the semiconductor device SD includes the second conductive film CF2.

When forming the second plug PLG2, the second conductive film CF2 also functions as a protective film for the ferroelectric film FEF. A height of the second plug PLG2 is smaller than a height of each of the first plug PLG1, third plug PLG3, and the fourth plug PLG4. Therefore, when forming the first plug PLG1, the second plug PLG2, the third plug PLG3 and the fourth plug PLG4 at the same time, an upper surface of the ferroelectric film FEF is easily damaged by etching. By the second conductive film CF2 is formed on the ferroelectric film FEF, the damage can be suppressed. From this viewpoint as well, it is preferable that the semiconductor device SD includes the second conductive film CF2.

The thickness of the second conductive film CF2 is, for example, 10 nm or more and 20 nm or less. The material of the second conductive film CF2 is, for example, titanium nitride, tantalum nitride or tungsten.

A pair of sidewall insulating films SWF is formed on the first surface SF1 of the semiconductor substrate SUB such that the pair of sidewall insulating films SWF sandwich the insulating film IF and the first conductive film CF1. The pair of sidewall insulating films SWF sandwich the ferroelectric film FEF, the second conductive film CF2, and the second plug PLG2 through a part of the insulating layer IL (a second insulating layer IL2). The sidewall insulating film SWF may be a single-layer film or a multi-layer film. In the present embodiment, the sidewall insulating film SWF is a multi-layer film including a first sidewall insulating film SW1 and a second sidewall insulating film SW2. The first sidewall insulating film SW1, in cross-sectional view, has a first part extending in the X-direction, and a second part extending in the Z-direction. The second sidewall insulating film SW2 is formed on the first sidewall insulating film SW1. A material of the sidewall insulating film SWF is silicon oxide or silicon nitride. For example, the first sidewall insulating film SW1 is a silicon nitride film, and the second sidewall insulating film SW2 is a silicon oxide film.

The insulating layer IL is formed on the first surface SF1 of the semiconductor substrate SUB such that the insulating layer IL covers the first conductive film CF1, the ferroelectric film FEF, the second conductive film CF2 and the pair of side wall insulating film SWF. The insulating layer IL includes a first insulating layer IL IL1 and a second insulating layer IL2.

The first insulating layer IL1, in a plan view, is formed on the first surface SF1 of the semiconductor substrate SUB in a region other than the region surrounded by the pair of sidewall insulating films SWF. A thickness of the first insulating layer IL1 is substantially the same as a thickness of the sidewall insulating film SWF. A material of the first insulating layer IL1 is, for example, silicon oxide.

The second insulating layer IL2 is formed on the first insulating layer IL1 such that the second insulating layer IL2 buries the region surrounded by the pair of sidewall insulating films SWF. A part of the second insulating layer IL2 is formed between the ferroelectric film FEF, the second conductive film CF2 and the third conductive film CF3, and the sidewall insulating film SWF. A material of the first insulating layer IL1 is, for example, silicon oxide.

The first plug PLG1 is formed in the insulating layer IL such that the first plug PLG1 reaches the first conductive film CF1. The first plug PLG1 is preferably formed at a position overlapping with the isolation insulating film IIF in plan view. Thus, when the first conductive film CF1 is integrally formed in the plurality of ferroelectric memory cells, one first plug PLG1 can be electrically connected with the plurality of memory cells. Thus, the plurality of the ferroelectric memory cells can be applied with a voltage through one first plug PLG1. As a result, the memory capacity can be enlarged. Further, in plan view, the first plug PLG1 is preferably located on an extension of the ferroelectric film FEF. This simplifies the layout of the memory arrays and increases the memory capacity.

In plan view, the first plug PLG1 may be located between the first short side SS1 of the first conductive film CF1 and the ferroelectric film FEF, or may be located between the first long side LS1 and the ferroelectric film FEF of the first conductive film CF1. It is preferable that the first plug PLG1 is located between the first short side SS1 of the first conductive film CF1 and the ferroelectric film FEF from the viewpoint of ease of manufacture. By locating the first plug PLG1 between the first long side LS1 of the first conductive film CF1 and the ferroelectric film FEF, the memory cell can be reduced and the size of semiconductor device SD can be reduced, resulting in reduced manufacturing costs.

A height of the first plug PLG1 is greater than a height of the second plug PLG2 and smaller than a height of each of the third plug PLG3 and the fourth plug PLG4. Here, "height of the plug" is the length of the plug in the Z-direction. A material of the first plug PLG1 is, for example, tungsten.

The second plug PLG2 is formed in the insulating layer IL such that the second plug PLG2 reaches the ferroelectric film FEF through the second conductive film CF2. The second plug PLG2 may directly reach the ferroelectric film FEF or indirectly reach the ferroelectric film FEF through the second conductive film CF2. A material of the second plug PLG2 is, for example, tungsten. The height of the second plug PLG2 is smaller than the height of each of the first plug PLG1, the third plug PLG3, and the fourth plug PLG4.

The third plug PLG3 is formed in the insulating layer IL such that the third plug PLG3 reaches the source region SR. A material of the third plug PLG3 is, for example, tungsten.

The fourth plug PLG4 is formed in the insulating layer IL such that the fourth plug PLG4 reaches the drain region DR. A material of the fourth plug PLG4 is, for example, tungsten.

In plan view, an alignment direction of the second plug PLG2, the third plug PLG3 and the fourth plug PLG4 is preferably the same as the opposing direction (X-direction) in which the source region SR and the drain region DR are opposite to each other. As a result, the source region SR and the drain region DR can be miniaturized, and as a result, the memory cell can be reduced in size.

Although not shown in particular, a wiring connected with each of the first plug PLG1, the second plug PLG2, the third plug PLG3 and the fourth plug PLG4 is formed on the insulating layer IL. Further, another plug formed in the insulating layer IL such that the another plug reaches the well region WR is formed. As a result, the potential can also be supplied to the well region WR.

[Operation of the Semiconductor Device SD]

Next, the operation of the semiconductor device SD will be described. Here, the operation of one ferroelectric memory cell constituting the semiconductor device SD will be described. Hereinafter, the write operation, the erase operation, and the read operation will be described, respectively.

Figure 4:
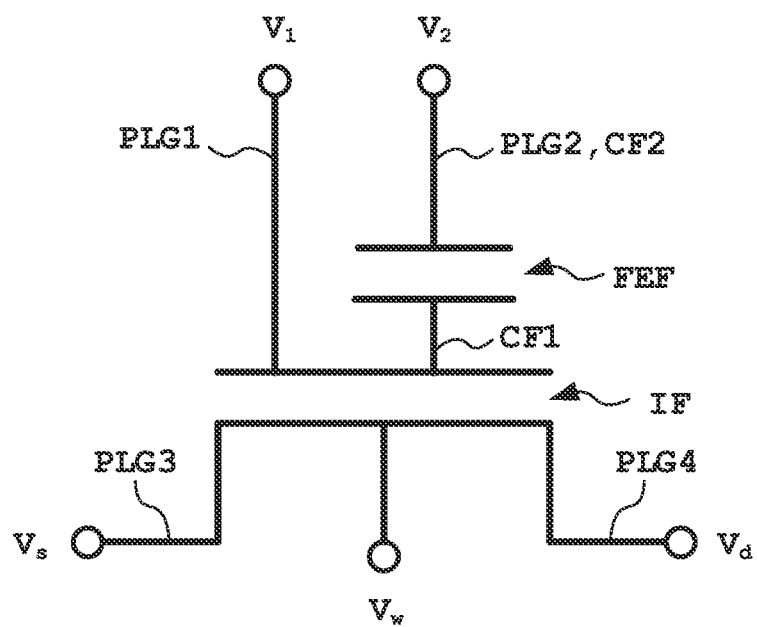
FIG. 4 is a circuit diagram illustrating an equivalent circuit of the main portion of the semiconductor device according to the embodiment.

FIG. 4 is a circuit diagram illustrating an equivalent circuit of the main portion of the semiconductor device SD. FIG. 5 is a table showing examples of voltages applied to respective portions of the semiconductor device SD in the write operation, the erase operation, and the read operation. In FIGS. 4 and 5, $V_s$ indicates a voltage applied to the source region SR. $V_d$ indicates a voltage applied to the drain region DR. $V_w$ indicates a voltage applied to the well region WR. $V_1$ indicates a voltage applied to the first conductive film CF1 through the first plug PLG1. $V_2$ indicates a voltage applied to the second conductive film CF2 through the second plug PLG2.

Here, a case in which the polarization state of the ferroelectric film FEF is a first polarization state (upward) is referred to as a "write state". In addition, a case in which the polarization state of the ferroelectric film FEF is a second polarization state (downward) that differs from the first polarization state will be described as an "erase state." A threshold voltage of the ferroelectric memory cell in the write state is assumed to be greater than the threshold voltage of the ferroelectric memory cell in the erase state.

(Write Operation)

With a voltage of the same magnitude applied to the source region SR and the drain region DR, a negative voltage $-V_{EC}$ is applied to the first conductive film CF1, and a positive voltage $V_{EC}$ is applied to the well region WR and the second conductive film CF2. Thus, the polarization state of the ferroelectric film FEF becomes the first polarization state. That is, the state of the ferroelectric memory cell becomes a write state. The voltage $V_{EC}$ is, for example, 3 V. The voltage of each of the source region SR and drain region DR is, for example, 0 V.

(Erase Operation)

A positive voltage $V_{EC}$ is applied to the first conductive film CF1 while a voltage of the same magnitude is applied to the source region SR and the drain region DR, and a negative voltage $-V_{EC}$ is applied to the well region WR and the second conductive film CF2. Thus, the polarization state of the ferroelectric film FEF becomes the second polarization state. That is, the ferroelectric memory cell become in the erased state. The voltage of each of the source region SR and drain region DR is, for example, 0 V.

(Read Operation)

Bias is applied between the source region SR and the drain region DR while a voltage $V_R$ of a predetermined magnitude is applied to the first conductive film CF1 and the second conductive film CF2. For example, a voltage $V_{dd}$ is applied to the source region SR, and the potentials of the drain region DR and the well region WR are set to 0 V. The voltage $V_{dd}$ is, for example, a voltage 1 V. From the viewpoint of preventing the polarization state of the ferroelectric film FEF from changing, the voltage $V_1$ applied to the first conductive film CF1 and the voltage $V_2$ applied to the second conductive film CF2 are the same to each other. The voltage $V_R$ is set to be greater than the threshold voltage of the ferroelectric memory cell in the erase state and smaller than the threshold voltage of the ferroelectric memory cell in the write state. As a result, no current flows in the ferroelectric memory cell in the programmed state, and a current flows in the ferroelectric memory cell in the erased state. In this manner, the state of the ferroelectric memory cell is read out based on the magnitude of the current value flowing in the ferroelectric memory cell. The voltage $V_R$ is, for example, 0 V.

Features of Embodiments

Features of the semiconductor device SD related to the present embodiment will be described. For comparison, a semiconductor device cSD (hereinafter also referred to as "a comparative semiconductor device") without the first plug PLG1 reaching the first conductive film CF1 will also be described.

Figure 6:
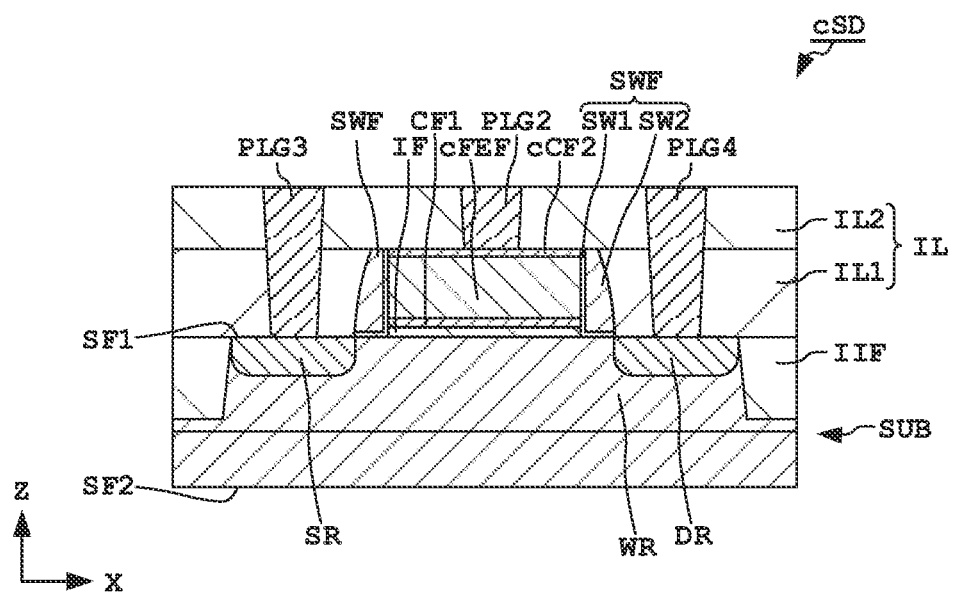
FIG. 6 is a cross-sectional view illustrating an exemplary configuration of a comparative semiconductor device.
Figure 7:
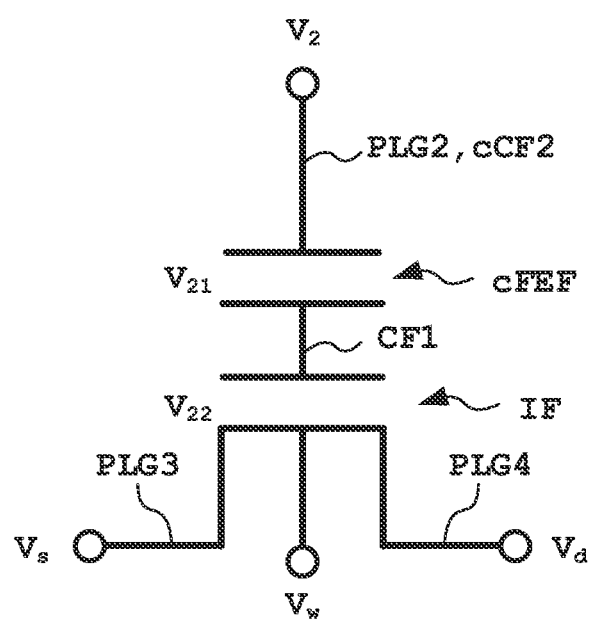
FIG. 7 is a circuit diagram illustrating an equivalent circuit of a main portion of the comparative semiconductor device.

FIG. 6 is a cross-sectional view illustrating an exemplary configuration of the comparative semiconductor device cSD. FIG. 7 is a circuit diagram illustrating an equivalent circuit of a main portion of the semiconductor device cSD.

As shown in FIG. 6, a size of each of the insulating film IF, the first conductive film CF1, the ferroelectric film cFEF and the second conductive film cCF2, in a plan view, is the same to each other. The comparative semiconductor device cSD does not include the first plug PLG1 configured to directly apply a voltage to the first conductive film CF1. That is, the voltage $V_1$ is not applied to the first conductive film CF1.

In the comparative semiconductor device cSD, the write operation is performed, for example, as follows. With a voltage of the same magnitude applied to the source region SR and the drain region DR, a negative voltage $-V_{EC}$ is applied to the well region WR, and a positive voltage $V_{EC}$ is applied to the second conductive film CF2. The erase operation is performed by making the positive and negative of the applied voltage opposite in comparison with the applied voltage of the write operation. Thus, in the comparative semiconductor device cSD, a voltage is applied to the ferroelectric film cFEF between the well region WR and the second conductive film CF2. That is, through the well region WR, a voltage is applied to the ferroelectric film cFEF.

As shown in FIG. 7, a capacitance component corresponding to the ferroelectric film cFEF, and a capacitance component corresponding to the insulating film IF are connected in series between the second conductive film CF2 and the well region WR. Therefore, even when a voltage is applied to the second conductive film CF2, it is divided into the ferroelectric film cFEF and the insulating film IF. For example, when the voltage applied to the second conductive film CF2 is $V_2$, the voltage $V_{21}$ distributed to the ferroelectric film cFEF and the voltage $V_{22}$ distributed to the insulating film IF are expressed by the following equations (1) and (2), respectively.

$$V_{21}=V_2/(1+C_1/C_2) \qquad (1)$$

$$V_{22}=V_2/(1+C_2/C_1) \qquad (2)$$

[Here, $C_1$ is a capacitance value of the capacitance component corresponding to the ferroelectric film cFEF. $C_2$ is a capacitance value of the capacitance component corresponding to the insulating film IF.]

As is apparent from the equations (1) and (2), the voltage $V_{21}$ distributed to the ferroelectric film cFEF varies depending on the magnitudes of $C_1$ and $C_2$, but is smaller than $V_2$. Therefore, in the comparative semiconductor device cSD, during the write operation and erase operation, the applied voltage distributed to the ferroelectric film cFEF may be inadequate. From the viewpoint of increasing the applied voltage distributed to the ferroelectric film cFEF, a mean of decreasing the thickness of the insulating film IF is conceivable in order to increase $C_2$ of the applied voltage. However, if the thickness of the insulating film IF is too small, the reliability of the semiconductor device cSD is reduced. Further, in order to reduce $C_1$, a mean for increasing the thickness of the ferroelectric film cFEF can be considered. However, there are also limitations in increasing the thickness of the ferroelectric film cFEF. Further, a mean for increasing $V_2$ of applied voltages is also conceivable. However, the driving voltage of the semiconductor device cSD increases.

In contrast, in the semiconductor device SD according to the present embodiment, a voltage is applied to the ferroelectric film FEF through the first plug PLG1 reaching the first conductive film CF1. Thus, the voltage applied is not distributed to the insulating film IF. Consequently, the reliability of the semiconductor device SD can be enhanced in the present embodiment compared to the comparative semiconductor device cSD. Further, since the applied voltage does not need to be increased, the driving voltage of the semiconductor device cSD can be reduced.

Method of Manufacturing Semiconductor Device

Next, an exemplary method of manufacturing the semiconductor device SD according to the present embodiment will be described. FIGS. 8 to 23 are cross-sectional views illustrating exemplary steps included in the method of manufacturing the semiconductor device SD.

The method of manufacturing the semiconductor device SD according to the embodiment includes (1) providing a semiconductor wafer SW, (2) forming the insulating film IF, (3) forming the first conductive film CF1, (4) forming an amorphous film AMF, (5) forming the second conductive film CF2, (6) crystallization, (7) a first patterning, (8) forming a sacrificial layer SL, (9) second patterning, (10) forming the sidewall insulating film SWF, (11) forming the source region SR and the drain region DR, (12) forming the first insulating layer IL1, (13) CMP, (14) removing the sacrificial layer SL, (15) forming the second insulating layer IL2, (16) forming the first plug PLG1, the second PLG2, the third plug PLG3, and the fourth plug PLG4.

(1) Providing a Semiconductor Wafer SW

Figure 8:
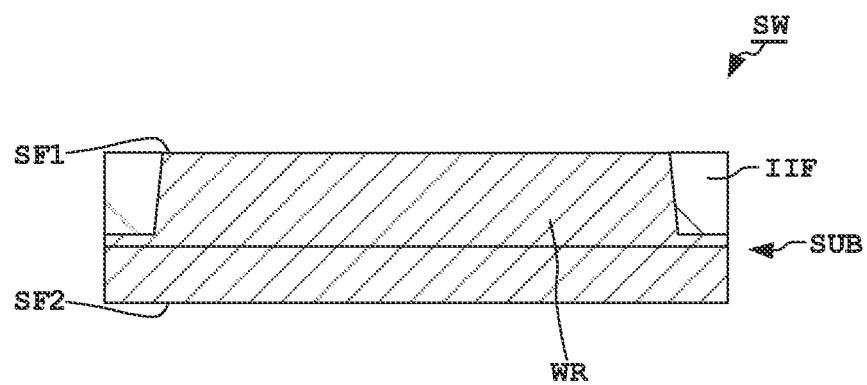
FIG. 8 is a cross-sectional view illustrating an exemplary step included in a method of manufacturing the semiconductor device according to the embodiment.

First, as shown in FIG. 8, a semiconductor wafer SW is provided. The semiconductor wafer SW according to the present embodiment, includes a semiconductor substrate SUB in which the well region WR and the isolation insulating film IIF are formed on the first surface SF1. The semiconductor wafer SW may be manufactured or purchased as a commercial product. The semiconductor wafer SW is, for example, a silicon wafer. For example, the well region WR and the isolation insulating film IIF may be formed in a silicon wafer purchased as a commercial product.

A method of forming the well region WR is not particularly limited. For example, by ion implantation and activation annealing, the well region WR is formed.

A method of forming the isolation insulating film IIF is not particularly limited. For example, by burying a recess portion formed on the semiconductor substrate SUB with an insulating film, the isolation insulating film IIF may be formed. Further, by oxidizing a part of the first surface SF1 of the semiconductor substrate SUB by LOCOS method, the isolation insulating film IIF may be formed.

(2) Forming the Insulating Film IF

Figure 9:
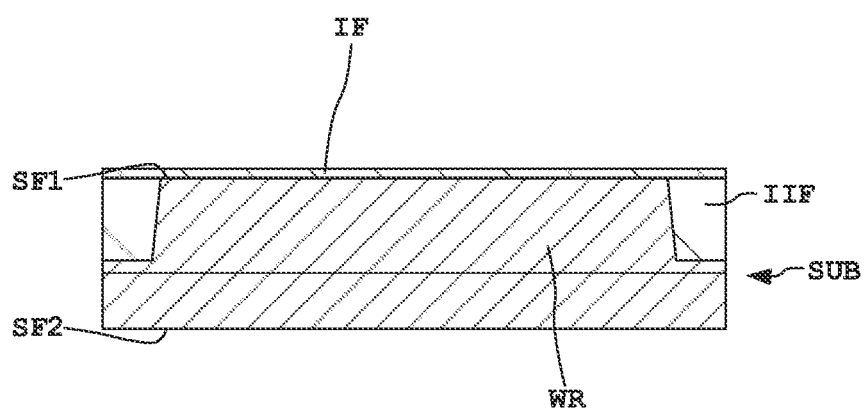
FIG. 9 is a cross-sectional view illustrating an exemplary step included in the method of manufacturing the semiconductor device according to the embodiment.

Subsequently, as shown in FIG. 9, the insulating film IF is formed on the first surface SF1 of the semiconductor substrate SUB. The insulating film IF is formed by, for example, a Chemical Vapor Deposition (CVD) method. In this step, the insulating film IF is not patterned, it is formed on an entire of the first surface SF1 of the semiconductor substrate SUB.

(3) Forming the First Conductive Film CF1

Figure 10:
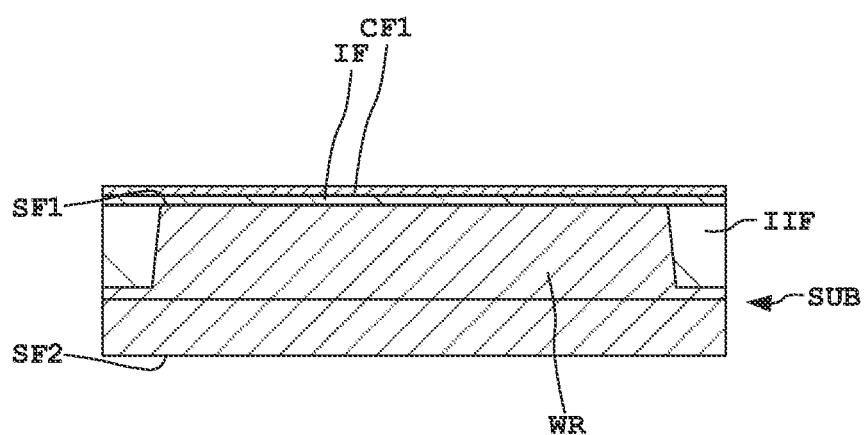
FIG. 10 is a cross-sectional view illustrating an exemplary step included in the method of manufacturing the semiconductor device according to the embodiment.

Subsequently, as shown in FIG. 10, the first conductive film CF1 is formed on the insulating film IF. A method of forming the first conductive film CF1 is, for example, a sputtering method. In this step, the first conductive film CF1 is not patterned, it is formed on an entire of the insulating film IF.

(4) Forming an Amorphous Film AMF

Figure 11:
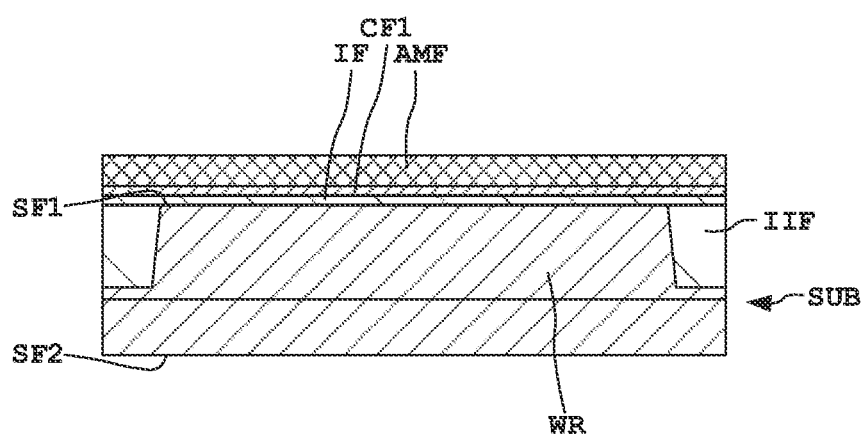
FIG. 11 is a cross-sectional view illustrating an exemplary step included in the method of manufacturing the semiconductor device according to the embodiment.

Subsequently, as shown in FIG. 11, an amorphous film AMF is formed on the first conductive film CF1. The amorphous film AMF is the ferroelectric film FEF before being crystallized. The amorphous film AMF is formed by, for example, an Atomic Layer Deposition (ALD) method.

When the crystallization promotion material is added to the amorphous film AMF, after the first amorphous film is formed, the crystallization promotion material may be formed on the first amorphous film by, for example, a sputtering method. In this case, after forming the crystallization promotion material, a second amorphous film is formed on the first amorphous film. Further, after forming the amorphous film AMF, for example, the crystallize promotion material may be formed in the amorphous film AMF by an ion implantation method.

(5) Forming the Second Conductive Film CF2

Figure 12:
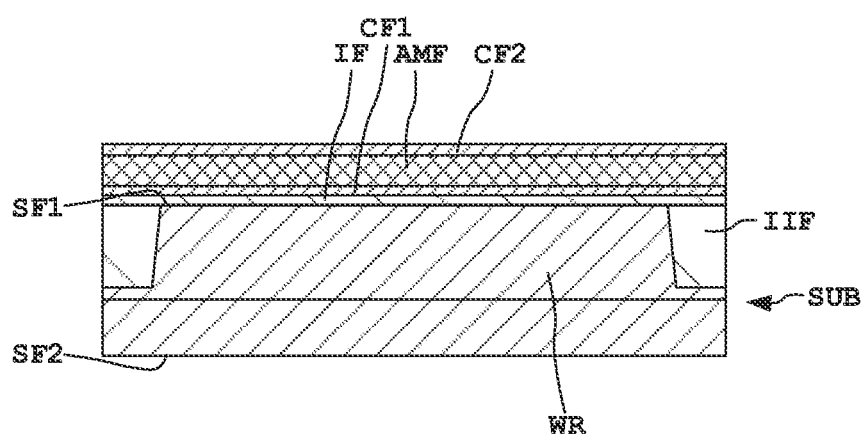
FIG. 12 is a cross-sectional view illustrating an exemplary step included in the method of manufacturing the semiconductor device according to the embodiment.

Subsequently, as shown in FIG. 12, the second conductive film CF2 is formed on the amorphous film AMF. A method of forming the second conductive film CF2 is, for example, a sputtering method. In this step, the second conductive film CF2 is not patterned and is formed on an entire of the amorphous film AMF.

(6) Crystallization

Figure 13:
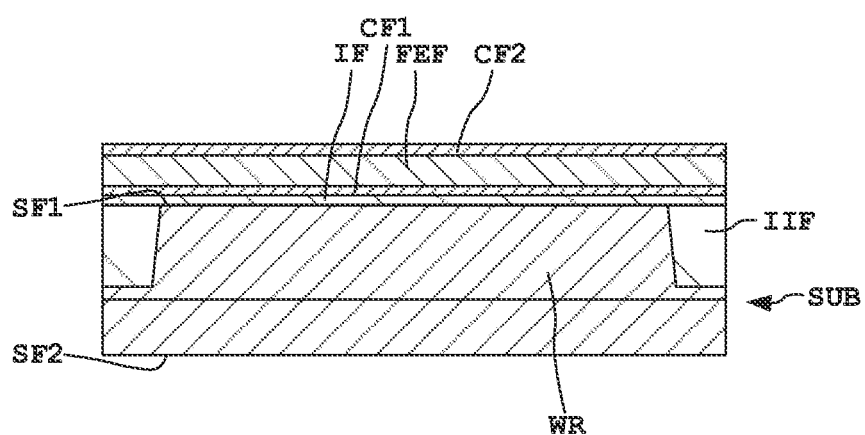
FIG. 13 is a cross-sectional view illustrating an exemplary step included in the method of manufacturing the semiconductor device according to the embodiment.

Subsequently, as shown in FIG. 13, the amorphous film AMF is crystallized to form the ferroelectric film FEF. A method of crystallization is heat treatment. The method of heat treatment is, for example, Rapid Thermal Annealing (RTA) method. In this case, the heating temperature of the amorphous film AMF is, for example, 600° C. or more and 800° C. or less. In this instance, when the heating temperature is more than 800° C. and 1000° C. or less, the crystal structure of the ferroelectric film FEF is likely to be monoclinic. As a result, the amorphous film AMF does not become a ferroelectric film, becomes a paraelectric film. In the present embodiment, the second conductive film CF2 is formed on the amorphous film AMF. Therefore, the ferroelectric film is easily formed by stresses from the second conductive film CF2.

Another method of the heat treatment is a heat treatment using the following microwaves frequency 1 GHz or more and 10 GHz or less. In this case, the heating temperature of the amorphous film AMF is, for example, 400° C. or less.

(7) First Patterning

Figure 14:
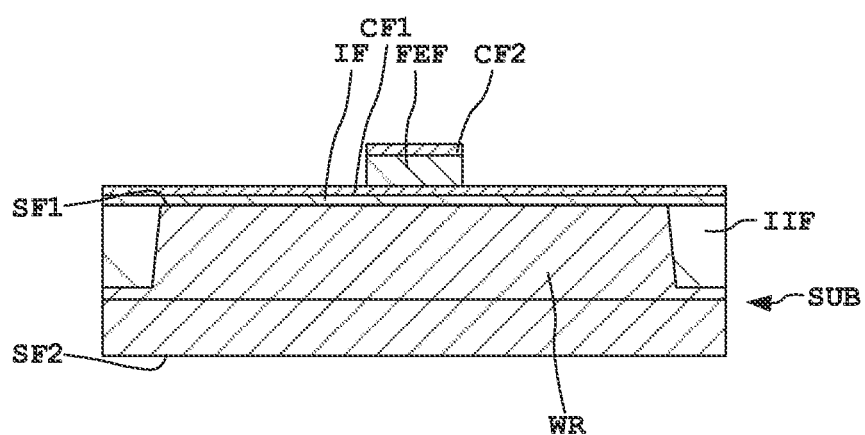
FIG. 14 is a cross-sectional view illustrating an exemplary step included in the method of manufacturing the semiconductor device according to the embodiment.

Subsequently, as shown in FIG. 14, the second conductive film CF2 and the ferroelectric film FEF are patterned into a desired pattern. Patterning is performed, for example, by photolithography and etching methods. Although not shown in particular, a resist mask is formed on a region other than a region to be etched.

(8) Formation a Sacrificial Layer SL

Figure 15:
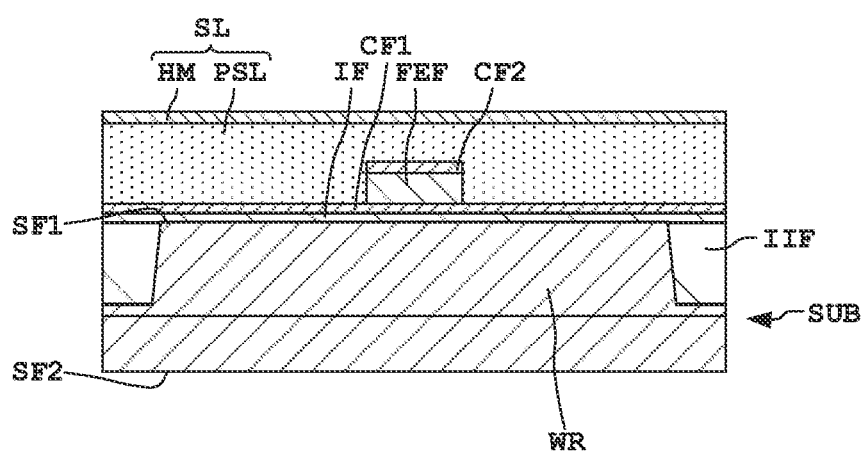
FIG. 15 is a cross-sectional view illustrating an exemplary step included in the method of manufacturing the semiconductor device according to the embodiment.

Subsequently, as shown in FIG. 15, a sacrificial layer SL is formed on the first conductive film CF1 so as to cover the second conductive film CF2 and the ferroelectric film FEF. The sacrificial layer SL includes, for example, a polycrystalline silicon layer PSL and a hard mask HM formed on the polycrystalline silicon layer PSL. The polycrystalline silicon layer PSL is formed, for example, by a CVD method. The hard mask HM is formed by, for example, a sputtering method.

(9) Second Patterning

Figure 16:
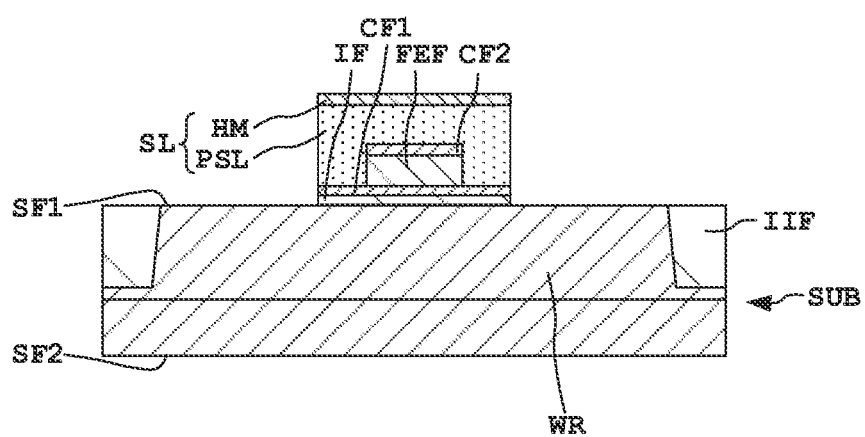
FIG. 16 is a cross-sectional view illustrating an exemplary step included in the method of manufacturing the semiconductor device according to the embodiment.

Subsequently, as shown in FIG. 16, the sacrificial layer SL, the first conductive film CF1 and the insulating film IF are patterned so that the desired pattern is achieved. Patterning is performed, for example, by photolithography and etching methods. Although not shown in particular, a resist mask is formed on a region other than a region to be etched.

(10) Forming the Sidewall Insulating Film SWF

Figure 17:
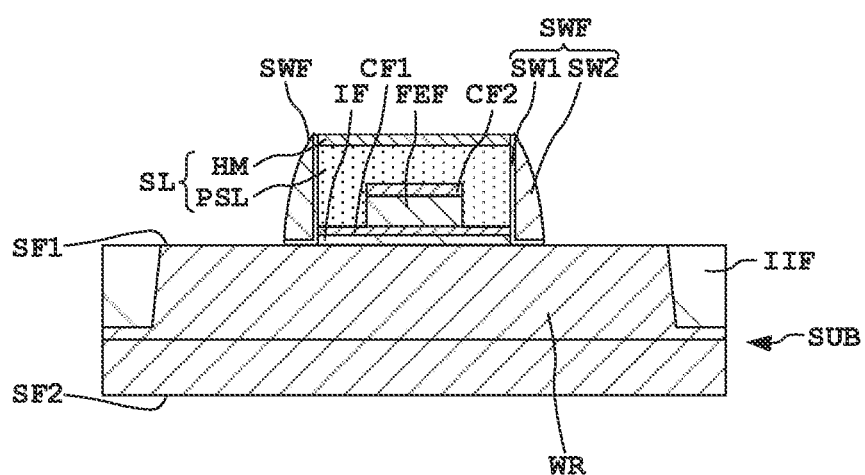
FIG. 17 is a cross-sectional view illustrating an exemplary step included in the method of manufacturing the semiconductor device according to the embodiment.

Subsequently, as shown in FIG. 17, the pair of sidewall insulating film SWF is formed on the first surface SF1 of the semiconductor substrate SUB so as to sandwich a structure consisting of the insulating film IF, the first conductive film CF1 and the sacrificial layer SL. After forming a multi-layer film of the first insulating film and the second insulating film is formed on the first surface SF1 of the semiconductor substrate SUB so as to cover the structure, a part of the layer film is removed so that a part located on a sidewall of the structure, of the multi-layer film, remains. The part of the multi-layer film is removed by, for example, a photolithography method and an etching method.

(11) Forming the Source Region SR and Drain Region DR

Figure 18:
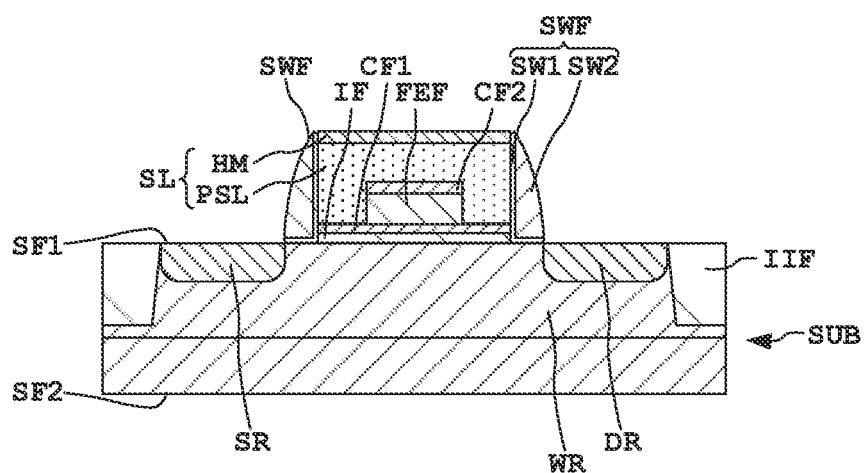
FIG. 18 is a cross-sectional view illustrating an exemplary step included in the method of manufacturing the semiconductor device according to the embodiment.

Subsequently, as shown in FIG. 18, the first surface SF1 of the semiconductor substrate SUB, the source region SR and the drain region DR are formed. A method of forming the source region SR and the drain region DR is not particularly limited. For example, the source region SR and the drain region DR are formed by ion implantation and activation annealing. Note that, although not particularly shown, in the ion implantation method, a resist mask is formed on a region other than a region where ion implantation is to be performed.

(12) Forming the First Insulating Layer IL1

Figure 19:
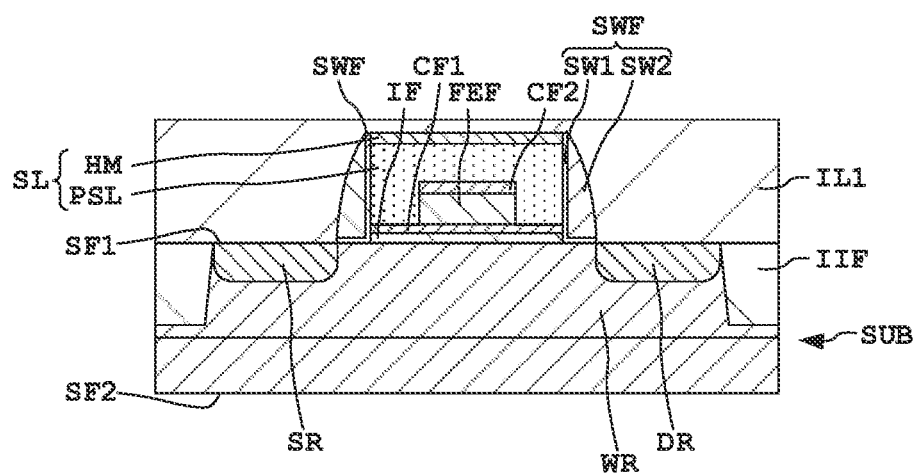
FIG. 19 is a cross-sectional view illustrating an exemplary step included in the method of manufacturing the semiconductor device according to the embodiment.

Subsequently, as shown in FIG. 19, the first insulating layer IL1 is formed on the semiconductor substrate SUB so as to cover the sacrificial layer SL and the sidewall insulating film SWF. A method of forming the first insulating layer IL1 is, for example, a CVD method.

(13) CMP

Figure 20:
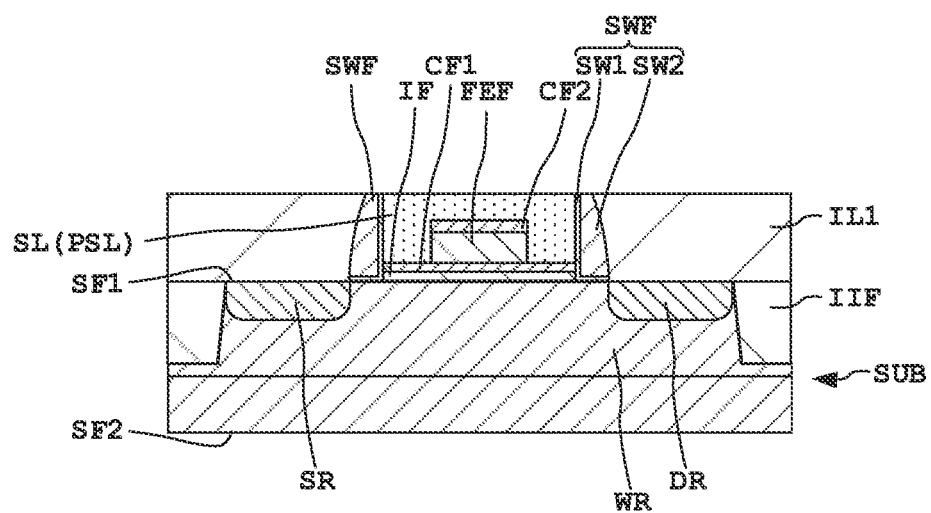
FIG. 20 is a cross-sectional view illustrating an exemplary step included in the method of manufacturing the semiconductor device according to the embodiment.

Subsequently, as shown in FIG. 20, an upper surface of the first insulating layer IL1 is polished so that the sacrificial layer SL is exposed from the first insulating layer IL1. In this instance, from the viewpoint of adjusting the height of the sidewall insulating film SWF, it may be polished part of the sidewall insulating film SWF. In this instance, a part of the sacrificial layer SL may be removed. In the present embodiment, the hard mask HM and a part of the polysilicon layer PSL are removed.

(13) Removing the Sacrificial Layer SL

Figure 21:
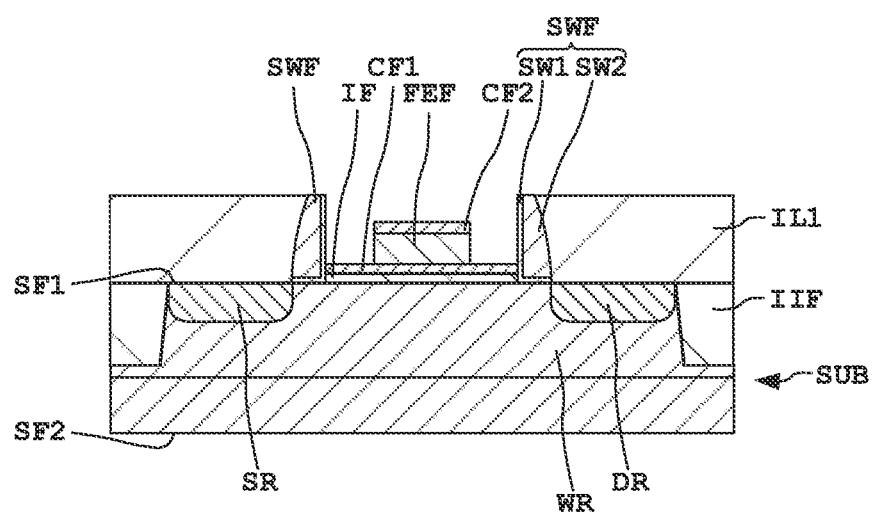
FIG. 21 is a cross-sectional view illustrating an exemplary step included in the method of manufacturing the semiconductor device according to the embodiment.

Subsequently, as shown in FIG. 21, the sacrificial layer SL is removed. In the present embodiment, the polysilicon layer PSL of the sacrificial layer SL is removed. A method of removing the sacrificial layer SL, for example, a wet etching method or an isotropic dry etching method. An etching solution used for wet etching is, for example, a mixed solution of aqueous ammonia and aqueous hydrogen peroxide.

(14) Forming the Second Insulating Layer IL2

Figure 22:
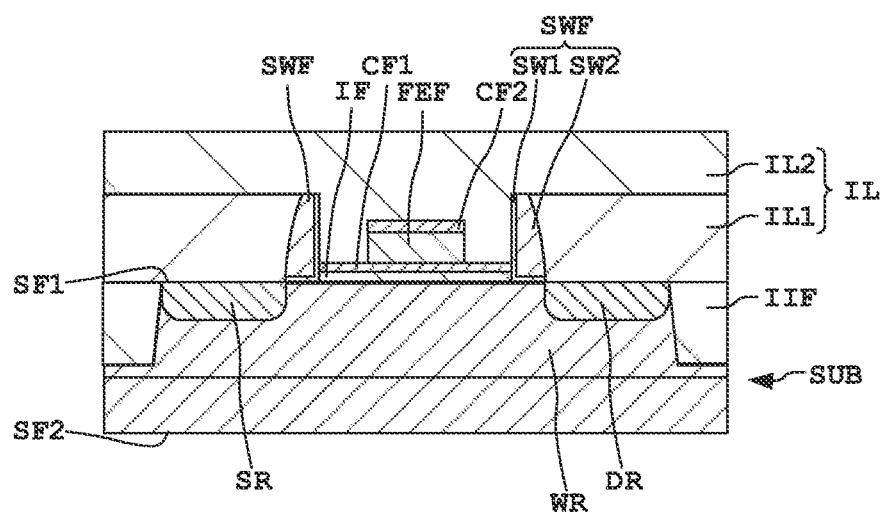
FIG. 22 is a cross-sectional view illustrating an exemplary step included in the method of manufacturing the semiconductor device according to the embodiment.

Subsequently, as shown in FIG. 22, the second insulating layer IL2 is formed on the first insulating layer IL1 so as to bury a region surrounded by the pair of sidewall insulating films SWF. As a result, the insulating layer IL including a first insulating layer IL IL1 and a second IL2 is formed. In the region surrounded by the pair of sidewall insulating films SWF, the second insulating layer IL2 is formed on the first conductive film CF1 so as to cover the ferroelectric film FEF and the second conductive film CF2. The method of forming the second insulating layer IL2 is, for example, a CVD method.

(15) Forming the First Plug PLG1, the Second Plug PLG2, the Third Plug PLG3, and the Fourth Plug PLG4

Figure 23:
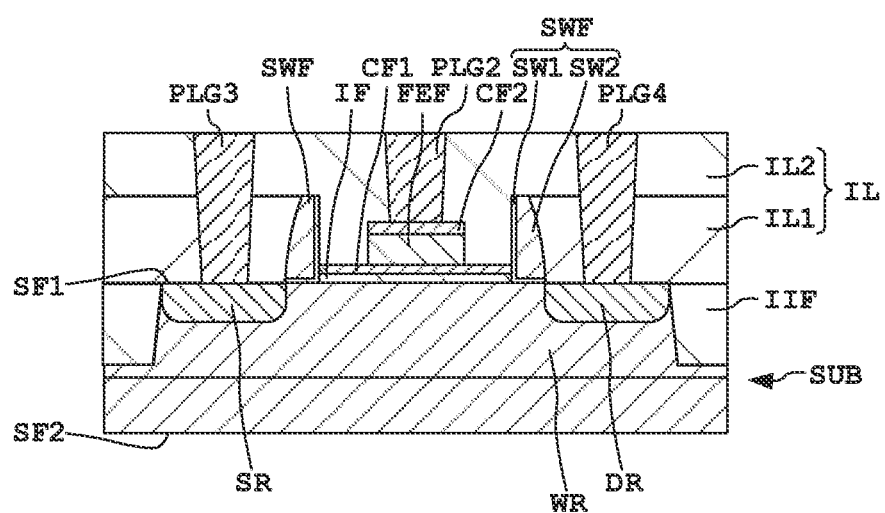
FIG. 23 is a cross-sectional view illustrating an exemplary step included in the method of manufacturing the semiconductor device according to the embodiment.

Subsequently, as shown in FIGS. 3 and 23, the first plug PLG1, the second plug PLG2, the third plug PLG3 and the fourth plug PLG4 are formed in the insulating layer IL. The second plug PLG2 penetrates through the second insulating layer IL2 so as not to overlap with the first insulating layer IL1 in plan view. The first plug PLG1, the third plug PLG3 and the fourth plug PLG4 penetrate through the first insulating layer IL1 and the second insulating layer IL2. After a through hole is formed in insulating layer IL, then a conductive material is buried in the through hole. As a result, each of the first plug PLG1, the second plug PLG2, the third plug PLG3 and the fourth plug PLG4 is formed.

Subsequently, although not particularly shown, a wiring layer is formed on the insulating layer IL. Finally, by dicing the structure obtained by the above steps, a plurality of singulated semiconductor devices SD are obtained.

The semiconductor device SD according to the present embodiment is manufactured by the manufacturing method.

(Effect)

In the semiconductor device SD according to the present embodiment, the first plug PLG1 is formed such that the first plug PLG1 reaches the first conductive film CF1, and the second plug PLG2 is formed through the second conductive film CF2 such that the second plug PLG2 reaches the ferroelectric film FEF. Thus, a voltage is applied to the ferroelectric film FEF between the first plug PLG1 and the second plug PLG2 without passing through the well region WR. Therefore, in the write operation and the erase operation, the voltage for applying to the ferroelectric film FEF is not divided into the insulating film IF. Voltage of the desired magnitude can be applied to the ferroelectric film FEF. As a result, the reliability of the semiconductor device SD can be enhanced. Further, since the voltage for applying to the ferroelectric film FEF is not divided into the insulating film IF, it is not necessary to increase the applied voltage. Consequently, the present embodiment can reduce the drive voltage of the semiconductor device SD.

First Modification

Figure 24:
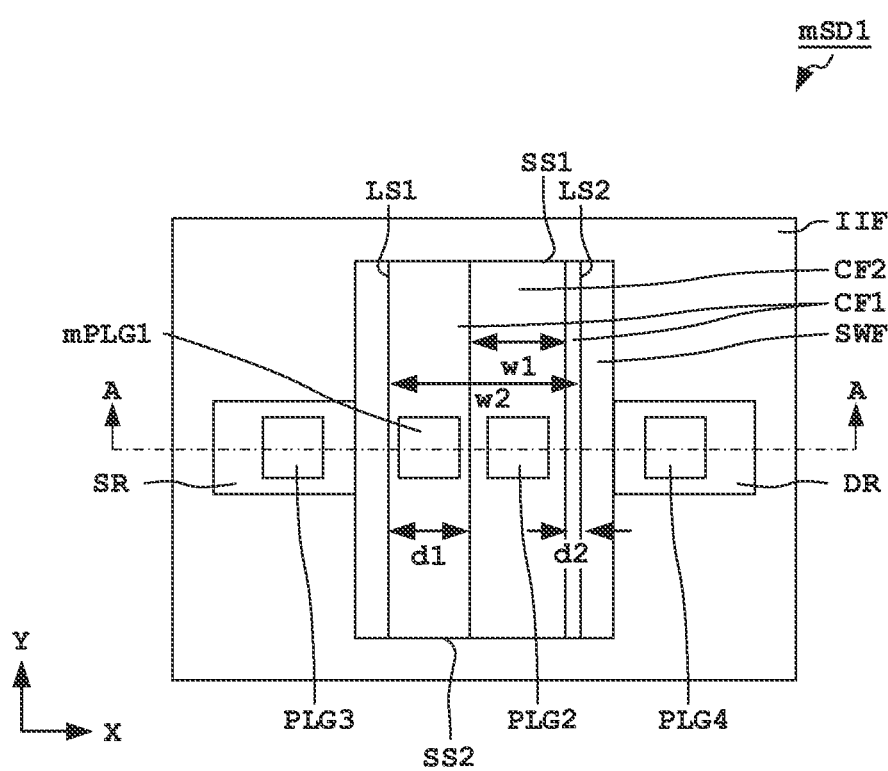
FIG. 24 is a plan view illustrating an exemplary configuration of a main portion of a semiconductor device according to a first modification of the embodiment.
Figure 25:
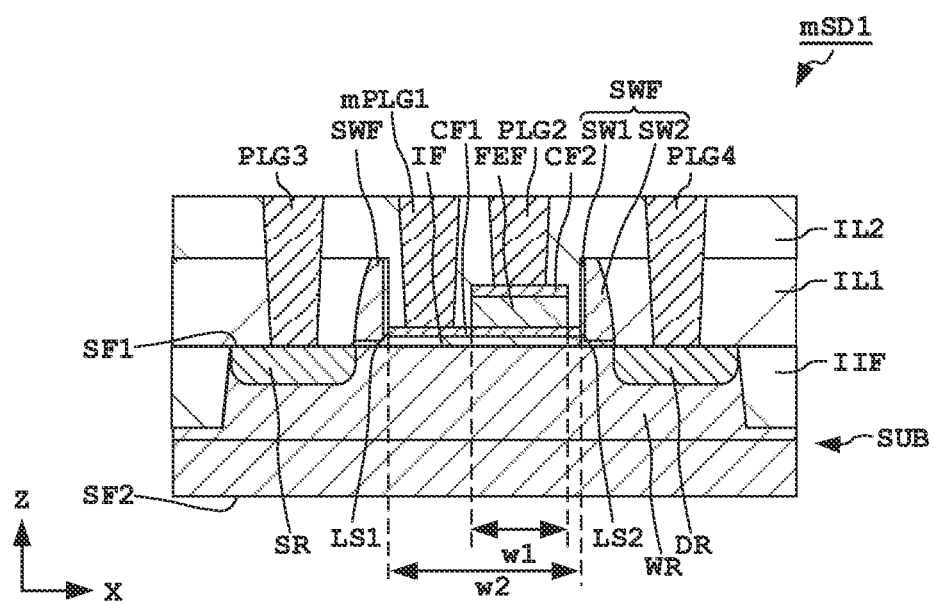
FIG. 25 is a cross-sectional view illustrating an exemplary configuration of the main portion of the semiconductor device according to the first modification of the embodiment.

FIG. 24 is a plan view illustrating an exemplary configuration of a main portion of a semiconductor device mSD1 according to a first modification of the present embodiment. FIG. 25 is a cross-sectional view illustrating an exemplary configuration of the main portion of the semiconductor device mSD1. FIG. 25 is a cross-sectional view taken along line A-A of FIG. 24.

In the semiconductor device mSD1 according to first modification, in plan view, a first plug mPLG1, the second plug PLG2, the third plug PLG3, and the fourth plug PLG4 are disposed along the opposing direction (X direction) in which the source region SR and the drain region DR are opposite to each other. The first plug mPLG1, in plan view, is formed between the pair of sidewall insulating films SWF. The first plug mPLG1 penetrates through the second insulating layer IL2 without overlapping the first insulating layer IL1 in plan view.

In the first modification, in the X-direction, the distance d1 of the first long side LS1 and the ferroelectric film FEF is greater than the distance d2 of the second long side LS2 and the ferroelectric film FEF. That is, in plan view, the ferroelectric film FEF is closer to the drain region DR than the source region SR. Thus, between the ferroelectric film FEF and the sidewall insulating film SWF, an region for forming the first plug mPGL1 is ensured. As a result, the first plug mPGL1 is disposed in the memory cell, and a region of the memory cell can be reduced.

The second plug PLG2 penetrates through the second insulating layer IL2 without overlapping the first insulating layer IL1 in plan view.

In the first modification, a plurality of first plugs mPLG1 may be formed in each of a plurality of memory cells. Thus, a voltage can be applied to the first conductive film CF1 formed in each of the plurality of memory cells through the first plug mPLG1. Therefore, the accuracy can be improved relative to the control of the memory window and write/erase operations. Consequently, the reliability of the semiconductor device mSD1 can be improved.

Second Modification

Figure 26:
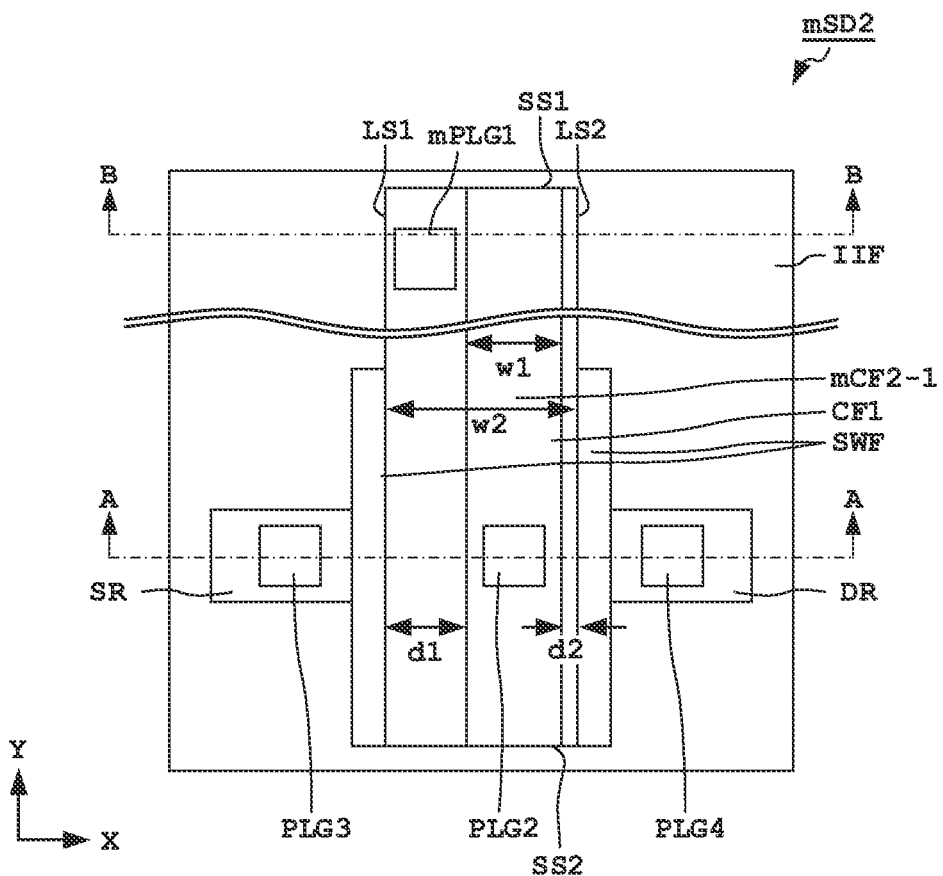
FIG. 26 is a plan view illustrating an exemplary configuration of a main portion of a semiconductor device according to a second modification of the embodiment.
Figure 27:
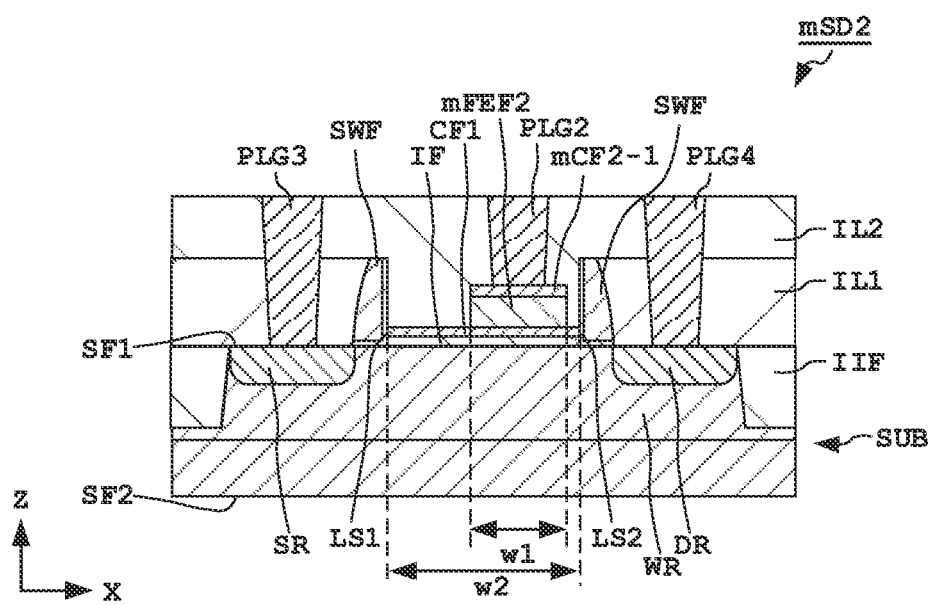
FIG. 27 is a cross-sectional view illustrating an exemplary configuration of the main portion of the semiconductor device according to the second modification of the embodiment.

FIG. 26 is a plan view illustrating an exemplary configuration of a main portion of a semiconductor device mSD2 according to a second modification of the present embodiment. FIG. 27 is a cross-sectional view illustrating an exemplary configuration of the main portion of the semiconductor device mSD2. FIG. 27 is a cross-sectional view taken along line A-A of FIG. 26.

In the semiconductor device mSD2 according to the second modification, in plan view, the first plug mPLG1 overlaps with the isolation insulating film IIF, and is formed between the first long side LS1 and a ferroelectric film mFEF2 of the first conductive film CF1. In addition to the effects of first modification, the ease of manufacturing can be improved. In particular, the margins for short between the first plug mPGL1 and second plug PGL2 and short between the first plug mPLG1 and the second conductive film mCF2-1 can be increased.

Third Modification

Figure 28:
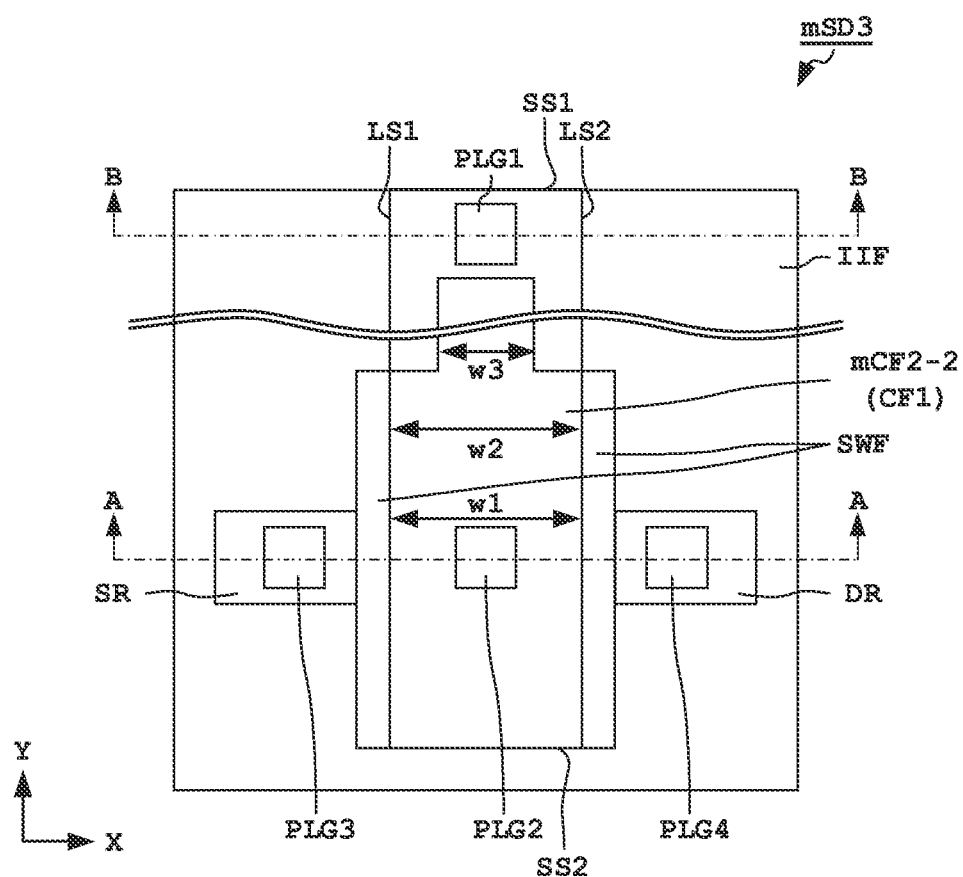
FIG. 28 is a plan view illustrating an exemplary configuration of a main portion of a semiconductor device according to a third modification of the embodiment.
Figure 29:
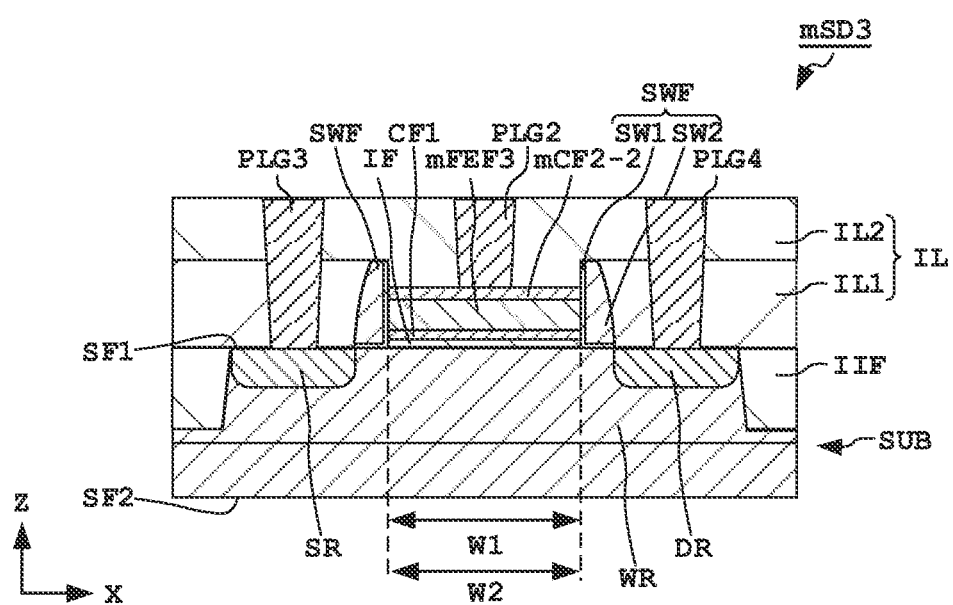
FIG. 29 is a cross-sectional view illustrating an exemplary configuration of the main portion of the semiconductor device according to the third modification of the embodiment.

FIG. 28 is a plan view illustrating an exemplary configuration of a main portion of a semiconductor device mSD3 according to a third modification of the present embodiment. FIG. 29 is a cross-sectional view illustrating an exemplary configuration of the main portion of the semiconductor device mSD3. FIG. 29 is a cross-sectional view taken along line A-A of FIG. 28.

In the semiconductor device mSD3 according to third modification, the length (width) w1 of a ferroelectric film mFEF3 located on the region between the source region SR and the drain region DR is substantially the same as the length (width) w2 of the first conductive film CF1 in the X-direction. In plan view, a size of the ferroelectric film mFEF3 is the same as a size of the second conductive film mCF2-2. In the X-direction, of the ferroelectric film mFEF3, the length (width) w3 of a part located on the isolation insulating film IIF is smaller than the length (width) w2 of the first conductive film CF1. In the third modification, the ferroelectric film mFEF3 directly contacts with the sidewall insulating film SWF.

In the third modification, the w1 is substantially the same as the w2. Thus, the insulating film IF, the first conductive film CF1, the ferroelectric film mFEF3 and second conductive film CF2, can be processed in a common process. Consequently, the manufacturing cost of the semiconductor device mSD3 can be reduced. Further, it is possible to suppress damage to the ferroelectric film mFEF3 in the removing step of the sacrificial layer SL since the ferroelectric film mFEF3 directly contacts with the sidewall insulating film SWF. More specifically, it is possible to suppress the scraping of the side surface of the ferroelectric film mFEF3 due to the dry etching method or wet etching method. As a result, it is possible to suppress deterioration of the memory characteristics of the semiconductor device mSD3.

It should be noted that the present invention is not limited to the above-mentioned embodiments, and various modifications can be made without departing from the gist thereof.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and an embodiment containing other components is not excluded.

What is claimed is:

1. A semiconductor device comprising:
an isolation insulating film formed on a semiconductor substrate;
a well region formed in a region of the semiconductor substrate separated by the isolation insulating film;
a source region and a drain region formed on the well region;
an insulating film formed on the well region such that the insulating film is located between the source region and the drain region in plan view;
a first conductive film formed on the insulating film;
a ferroelectric film formed on the first conductive film;
an insulating layer formed on the semiconductor substrate such that the insulating layer covers the first conductive film and the ferroelectric film;
a first plug formed in the insulating layer such that the first plug reaches the first conductive film on the isolation insulating film;
a second plug formed in the insulating layer such that the second plug reaches the ferroelectric film on the well region;
a third plug formed in the insulating layer such that the third plug reaches the source region; and
a fourth plug formed in the insulating layer such that the fourth plug reaches the drain region,
wherein a height of the third plug or the fourth plug is greater than a height of the first plug,
wherein, in plan view, the second plug, the third plug and the fourth plug are disposed along an opposing direction in which the source region and the drain region are opposite to each other,
wherein the isolation insulating film is formed on a main surface of the semiconductor substrate such that the isolation insulating film surrounds the source region and the drain region in a plan view, and
wherein, in plan view, the first plug overlaps with the isolation insulating film.

2. The semiconductor device according to claim 1, wherein, a material of the ferroelectric film contains hafnium and oxygen.

3. The semiconductor device according to claim 1, wherein, in plan view, a size of the ferroelectric film is smaller than a size of the insulating film.

4. The semiconductor device according to claim 1, wherein, in an opposing direction in which the source region and the drain region are opposite to each other, a length of the ferroelectric film is smaller than a length of the first conductive film.

5. The semiconductor device according to claim 1, further comprising:
   a second conductive film formed between the ferroelectric film and the second plug.

6. The semiconductor device according to claim 5, wherein a thickness of the first conductive film is smaller than a thickness of the second conductive film.

7. The semiconductor device according to claim 1,
   wherein the first conductive film has a first side and a second side which are located on opposite sides to each other in plan view, and
   wherein, in an opposing direction in which the source region and the drain region are opposite to each other, a distance between the first side and the ferroelectric film is substantially a same as a distance between the second side and the ferroelectric film.

8. The semiconductor device according to claim 1,
   wherein the first conductive film has a first short side and a second short side which are located on opposite sides to each other in plan view, and
   wherein, in plan view, the first plug is formed between the first short side and the ferroelectric film.

9. The semiconductor device according to claim 1,
   wherein the first conductive film has a first long side and a second long side which are located on opposite sides to each other in plan view, and
   wherein, in plan view, the first plug is formed between the first long side and the ferroelectric film.

10. The semiconductor device according to claim 1, wherein, in an opposing direction in which the source region and the drain region are opposite to each other, a length of a part of the ferroelectric film, which is located on a region between the source region and the drain region, is substantially a same as a length of the first conductive film.

11. The semiconductor device according to claim 1,
   wherein, in an opposing direction in which the source region and the drain region are opposite to each other, a length of a part of the ferroelectric film, which is located on the isolation insulating film, is smaller than a length of the first conductive film.

12. The semiconductor device according to claim 1,
   wherein a material of the first conductive film contains titanium nitride,
   wherein a material of the first plug contains tungsten, and
   wherein a material of the second plug contains tungsten.

13. The semiconductor device according to claim 1, further comprising:
   a pair of sidewall insulating films formed on the semiconductor substrate such that the pair of sidewall insulating films sandwich the insulating film and the first conductive film,
   wherein the pair of sidewall insulating films sandwich the ferroelectric film through a part of the insulating layer.

14. The semiconductor device according to claim 1,
   wherein, in plan view, the first plug, the second plug, the third plug, and the fourth plug are disposed along an opposing direction in which the source region and the drain region are opposite to each other.

* * * * *